US006726764B2

(12) United States Patent
Mutti et al.

(10) Patent No.: US 6,726,764 B2
(45) Date of Patent: Apr. 27, 2004

(54) METHOD FOR CONTROLLING GROWTH OF A SILICON CRYSTAL TO MINIMIZE GROWTH RATE AND DIAMETER DEVIATIONS

(75) Inventors: Paolo Mutti, Merano (IT); Vladmir V. Voronknov, Merano (IT)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 10/008,812

(22) Filed: Nov. 13, 2001

(65) Prior Publication Data

US 2002/0043206 A1 Apr. 18, 2002

Related U.S. Application Data

(63) Continuation of application No. 09/495,563, filed on Feb. 1, 2000.

(51) Int. Cl.[7] .............................................. C30B 15/20
(52) U.S. Cl. ............................ 117/14; 117/13; 117/15; 117/201; 117/202
(58) Field of Search ............................. 117/13, 14, 15, 117/16, 201, 202

(56) References Cited

U.S. PATENT DOCUMENTS

| 3,621,213 A | 11/1971 | Jen et al. |
| 3,761,692 A | 9/1973 | Cope |
| 4,663,128 A | 5/1987 | Helgeland |
| 4,857,278 A | 8/1989 | Gevelber et al. |
| 5,935,328 A | 8/1999 | Cherko et al. |

FOREIGN PATENT DOCUMENTS

| EP | 0437775 A1 | 7/1991 |
| EP | 0444628 A1 | 9/1991 |
| EP | 0499220 A1 | 8/1992 |
| FR | 2071788 | 9/1971 |
| JP | 09087083 | 3/1997 |

OTHER PUBLICATIONS

Ammon Von et al., "The Dependence of Bulk Defects on the Axial Temperature Gradient of Silicon Crystals During Czochralski Growth," Journal of Crystal Growth, NL, North–Holland Publishing Co., Amsterdam, vol. 151, No. 3/04, pp. 273–277.

*Primary Examiner*—Robert Kunemund
(74) *Attorney, Agent, or Firm*—Senniger, Powers, Leavitt & Roedel (57) ABSTRACT

A control method for use with a crystal puller for growing a monocrystalline semiconductor crystal from a melt according to the Czochralski process. The method includes defining an initial interval of time for observing growth of the crystal being pulled from the melt and determining diameter variations occurring during the interval. Based on the variations in the crystal diameter, the method defines a function $r(t)$. By performing a best fit routine on the function $r(t)$, the method deduces current values of crystal radius $r_f$, meniscus height $h_f$ and growth rate $V_{gf}$ at the end of the observation interval. The method also includes determining pull rate and heater power parameters as a function of the growth rate to control the crystal puller to minimize variations in both crystal diameter and growth rate during subsequent growth of the crystal.

32 Claims, 5 Drawing Sheets

METHOD FOR CONTROLLING GROWTH OF A SILICON CRYSTAL TO MINIMIZE GROWTH RATE AND DIAMETER DEVIATIONS

CROSS REFERENCE TO RELATED APPLICATION

This application is a continuation of commonly assigned application Ser. No. 09/495,563, filed Feb. 1, 2000, the entire disclosure of which is incorporated herein by reference.

BACKGROUND OF THE INVENTION

This invention relates generally to improvements in controlling growth processes of single crystal semiconductors for use in the manufacture of electronic components and, particularly, to methods of accurately controlling growth in a Czochralski crystal growth process for minimizing deviations in both growth rate and diameter, including determining steady-state growth rate and controlling pull rate around the steady-state growth rate, independent of process conditions such as sensed melt temperature.

Monocrystalline, or single crystal, silicon is the starting material in most processes for fabricating semiconductor electronic components. Crystal pulling machines employing the Czochralski process produce the majority of single crystal silicon. Briefly described, the Czochralski process involves melting a charge of high-purity polycrystalline silicon in a quartz crucible located in a specifically designed furnace. After the heated crucible melts the silicon charge, a crystal lifting mechanism lowers a seed crystal into contact with the molten silicon. The mechanism then withdraws the seed to pull a growing crystal from the silicon melt. A typical crystal lifting mechanism suspends the seed crystal from one end of a cable, the other end of which is wrapped around a drum. As the drum rotates, the seed crystal moves up or down depending on the direction that the drum is rotating.

After formation of a crystal neck, the growth process enlarges the diameter of the growing crystal by decreasing the pulling rate and/or the melt temperature until a desired diameter is reached. By controlling the pull rate and the melt temperature while compensating for the decreasing melt level, the main body of the crystal is grown so that it has an approximately constant diameter (i.e., it is generally cylindrical). Near the end of the growth process but before the crucible is emptied of molten silicon, the process gradually reduces the crystal diameter to form an end cone. Typically, the end cone is formed by increasing the crystal pull rate and heat supplied to the crucible. When the diameter becomes small enough, the crystal is then separated from the melt. During the growth process, the crucible rotates the melt in one direction and the crystal lifting mechanism rotates its pulling cable, or shaft, along with the seed and the crystal, in an opposite direction.

Although presently available Czochralski growth processes have been satisfactory for growing single crystal silicon useful in a wide variety of applications, further improvements are still desired. For example, conventional growth processes employ one of two main strategies for crystal growth control. First, standard control aims primarily to control diameter of the growing crystal. Second, "locked seed lift" control aims primarily to control growth rate. It is desired to minimize deviations in both diameter and growth rate simultaneously throughout the growth process to improve the shape and the quality of the as-grown crystal.

The problem of minimizing growth rate variations involves reliably measuring growth rate. In conventional growth processes, the pull rate, which is set by the seed lift, is a known parameter. The growth rate can be determined indirectly by examining the meniscus dynamics if the height of the meniscus at the crystal-melt interface is known as a function of time. In an ideal case, the ingot has a perfectly cylindrical shape and the pull rate is identical to the growth rate. Achieving relatively small deviations in crystal diameter is coupled to achieving relatively small deviations in growth rate from the prescribed value. Although attempts have been made using pyrometers or laser reflections from meniscus shape, a reliable system for measuring meniscus height is not available. Therefore, improvements in crystal growing processes are desired for determining growth rate without measuring meniscus height.

A controller is also desired for solving the problem of unstable crystal growth. In particular, such a controller is needed for maintaining a stable crystal growth for the duration of the growth process by minimizing diameter variations. Those skilled in the art recognize that pulling a crystal from a melt is an intrinsically unstable process. Without control, the crystal will grow in a conical, rather than generally cylindrical, shape. Active control loops are necessary to maintain the cylindrical shape, which means keeping the pull rate close to the steady-state growth rate. Perturbations in the steady-state growth rate can be time-dependent and can differ from run to run and/or puller to puller.

As described above, conventional growth processes use two main strategies for crystal growth control. The first primarily involves diameter control and the second primarily involves a "locked seed lift" for growth rate control. The presently available systems, however, do not provide simultaneous control of diameter and growth rate. For example, standard diameter control manages crystal growth by means of two PID (Proportional Integral Derivative) control loops acting on pull rate and heater power. The primary objective of the controller is to grow a crystal at diameter equal to a set value (given other process parameters such as crystal and crucible rotation or the presence of magnetic fields). The first PID control unit acts on pull rate to minimize the diameter error. As a secondary objective, the puller controller seeks to minimize the error between the average pull rate and the set value. This is accomplished by means of the second PID control loop acting on heater power. With the standard PID control system, diameter variation can be set to a tolerance of about 1 mm but relatively large pull rate deviations from the set value can still occur (e.g., even of the order of 30–40%).

The primary objective of conventional seed lift control systems is growth rate control. In this instance, pull rate is set to a constant prescribed value $V_{set}$. Diameter control is of secondary importance and is generally accomplished by means of a PID control unit acting directly on the heater power. Although this control strategy precisely controls pull rate relative to the set value, relatively large diameter deviations (e.g., up to ±5–10 mm) are possible. Moreover, the actual growth rate still deviates even though the pull rate equals $V_{set}$ so the main goal of growth rate control is not completely achieved.

By properly tuning the controller, acceptable performance with respect to the growth rate may be possible with presently available control systems. In this instance, proper tuning means empirically setting the various controller coefficients by trial and error given a particular hot zone configuration and a set of process parameters. The set of coefficients is defined for different portions of the crystal length to compensate for changes in the thermal configuration caused by the batch nature of the process. Given the number of different zones taken into consideration and the type of controller, a very large number of coefficients (e.g., 50–100 or more) must be properly tuned to obtain acceptable growth characteristics. Any change in hot zone design or process conditions, such as crucible or crystal rotations or an applied magnetic field, can negatively impact the performance of the controller. More re-tuning iterations are then necessary to accommodate such changes. In addition, critical processes where minimum tolerances are set for diameter and growth rate deviations often must be personalized for each puller. Tuning and optimization of process control parameters, updating of control parameters to new hot zone configurations or process conditions, and management of puller dependent processes is very cumbersome and costly. Thus, a reduction in the number of iterations needed to achieve acceptable process performance or a reduction in resources dedicated to process maintenance and personalization will provide significant cost savings in producing superior silicon crystals.

For these reasons, an accurate and reliable apparatus and method for controlling silicon crystal growth to minimize both growth rate deviations and diameter deviations that is less costly and easier to tune is desired.

SUMMARY OF THE INVENTION

The invention meets the above needs and overcomes the deficiencies of the prior art by providing methods of minimizing both growth rate deviations and diameter deviations in a crystal ingot pulled from a melt according to the Czochralski process. Among the several objects of the invention may be noted the provision of such methods that reduce the number of control parameters; the provision of such methods that permit determining the control parameters independently of crystal position, hot zone configuration, process conditions and/or puller; the provision of such methods that permit determining the control parameters from observation of diameter evolution; the provision of such methods that predict desired interventions on the pull rate and the power; the provision of such methods that permit tuning the control parameters during the run; the provision of such methods that permit deriving the meniscus height dynamics from measured radius dynamics; the provision of such methods that permit determining meniscus height measurements as a function of the derived meniscus height dynamics; the provision of such methods that may be incorporated into existing crystal pulling devices; and the provision of such methods that can be carried out efficiently and economically.

Briefly described, a method embodying aspects of the invention is for use with a crystal puller for growing a monocrystalline semiconductor crystal according to the Czochralski process. The crystal puller has a heated crucible containing a semiconductor melt from which the crystal is grown. The crystal puller also has a heater supplied by a power supply for heating the crucible. The crystal is grown on a seed crystal pulled from the melt at a pull rate $V_p$. The method includes defining an initial interval of time for observing growth of the crystal being pulled from the melt and determining variations in crystal diameter occurring during the observation interval. Based on the variations in the crystal diameter, the method estimates a current growth rate $V_g$ at which the crystal is being grown. The method also includes estimating a current steady-state value of the growth rate $V_{gs}$ as a function of the estimated growth rate $V_{gf}$ at the end of the observation interval and determining a pull rate parameter and a heater power parameter as a function of the estimated steady-state growth rate $V_{gs}$. The pull rate parameter is representative of an incremental change in the pull rate $V_p$ to effect a desired change in the diameter of the crystal toward a target diameter and the heater power parameter is representative of an incremental change in the power supplied to the heater to effect a desired change in the growth rate of the crystal toward a target growth rate. According to the invention, the parameters are determined independently of a temperature condition sensed during pulling. The method further includes adjusting the pull rate $V_p$ according to the pull rate parameter and adjusting the power supplied to the heater by the power supply according to the heater power parameter. This minimizes variations in both crystal diameter and growth rate during subsequent growth of the crystal following the initial observation interval.

Another embodiment of the invention is directed to a control method for use with a crystal puller for growing a monocrystalline semiconductor crystal according to the Czochralski process. The crystal puller has a heated crucible containing a semiconductor melt from which the crystal is grown. The crystal puller also has a heater supplied by a power supply for heating the crucible. The crystal is grown on a seed crystal pulled from the melt at a pull rate $V_p$. The melt has a surface with a meniscus adjacent the crystal as the crystal is pulled from the melt. The method includes defining an initial interval of time for observing growth of the crystal being pulled from the melt and determining variations in crystal diameter occurring during the observation interval. In addition, the method includes defining a function r(t) based on the variations in crystal diameter occurring during the observation interval. The function r(t) represents radius variations and is a function of current values of crystal radius r, meniscus height h and growth rate $V_g$ with respect to time. The method then performs a best fit routine on the function r(t) to deduce the current values of crystal radius $r_f$, meniscus height $h_f$ and growth rate $V_{gf}$ at the end of the observation interval. In turn, a current steady-state value of the growth rate $V_{gs}$ is calculated as a function of the deduced current values of crystal radius $r_f$, meniscus height $h_f$ and growth rate $V_{gf}$ at the end of the observation interval and independent of melt temperature and meniscus height sensed during pulling. The method further includes controlling the crystal puller as function of current steady-state growth rate $V_{gs}$ to minimize variations in both crystal diameter and growth rate during subsequent growth of the crystal.

In yet another embodiment, a method of the invention is for use with a crystal puller for growing a monocrystalline semiconductor crystal according to the Czochralski process. The crystal puller has a heated crucible containing a semiconductor melt from which the crystal is grown. The crystal puller also has a heater supplied by a power supply for heating the crucible. The crystal is grown on a seed crystal pulled from the melt at a pull rate $V_p$. The method includes defining an initial interval of time for observing growth of the crystal being pulled from the melt and determining variations in crystal diameter occurring during the observation interval. Based on the variations in the crystal diameter, the method estimates a current growth rate $V_g$ at which the crystal is being grown. The method also includes estimating a current steady-state value of the growth rate $V_{gs}$ as a function of the estimated growth rate $V_{gf}$ at the end of the observation interval and independent of meniscus height measured during pulling. In turn, the method determines a pull rate parameter and a heater power parameter as a function of the estimated steady-state growth rate $V_{gs}$. The pull rate parameter is representative of an incremental change in the pull rate $V_p$ to effect a desired change in the diameter of the crystal toward a target diameter and the heater power parameter is representative of an incremental change in the power supplied to the heater to effect a desired change in the growth rate of the crystal toward a target growth rate. The method further includes adjusting the pull rate $V_p$ according to the pull rate parameter and adjusting the power supplied to the heater by the power supply according to the heater power parameter. This minimizes variations in both crystal diameter and growth rate during subsequent growth of the crystal following the initial observation interval.

Alternatively, the invention may comprise various other methods and systems.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION OF PREFERRED EMBODIMENTS

Figure 1:
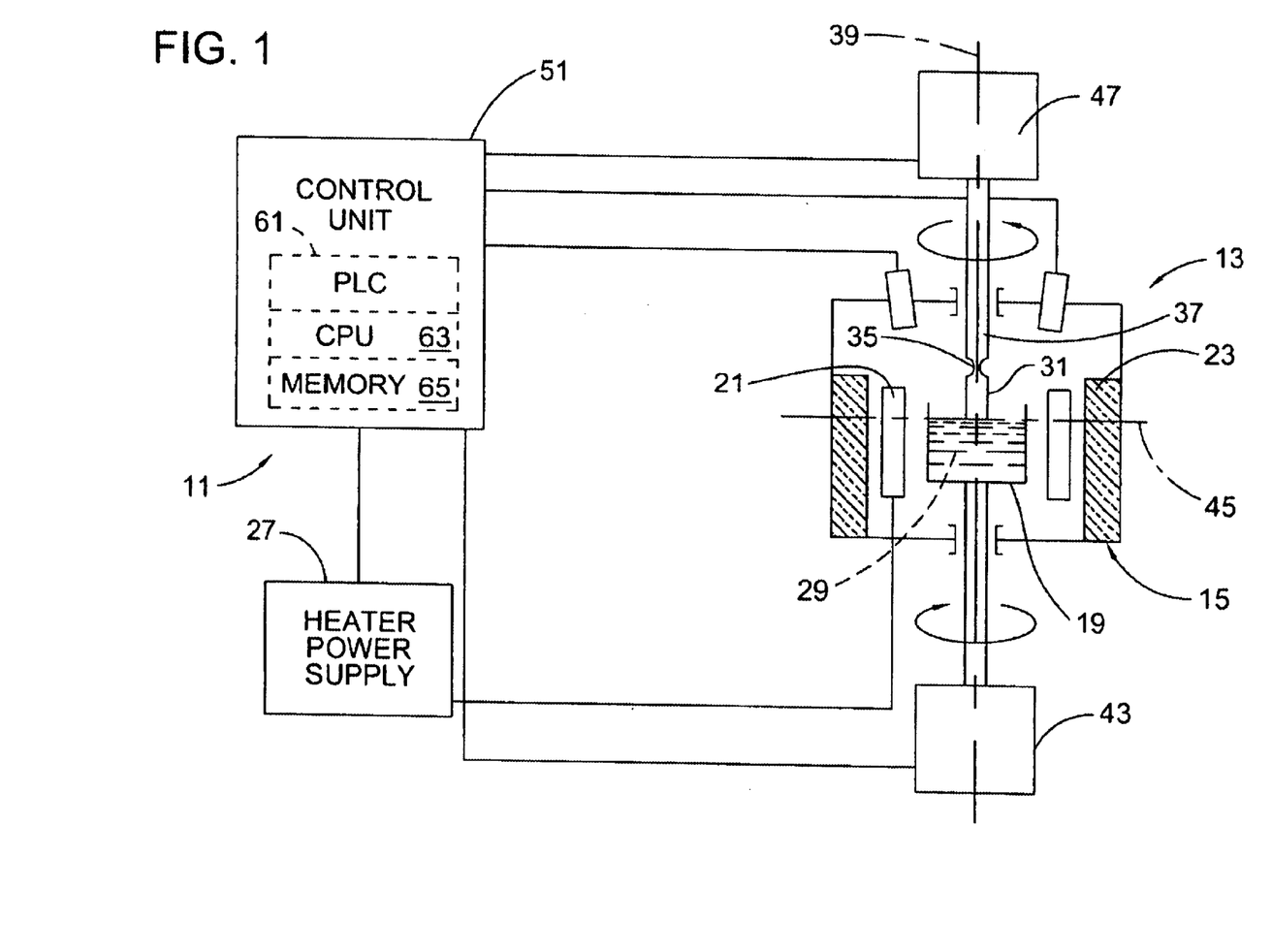
FIG. 1 is a partially schematic, block diagram illustrating a crystal puller and an apparatus according to the present invention for controlling the crystal puller.

Referring now to FIG. 1, a control apparatus, indicated generally at 11, is shown for use with a Czochralski crystal growing apparatus, indicated generally at 13. The details of construction of the crystal growing apparatus, or puller, 13 are well known to those of ordinary skill in the art. In general, the crystal puller 13 includes a vacuum chamber 15 enclosing a crucible 19. Heating means such as a resistance heater 21 surrounds the crucible 19. In one embodiment, insulation 23 lines the inner wall of vacuum chamber 15 and a chamber cooling jacket (not shown) fed with water surrounds it. A vacuum pump (not shown) typically removes gas from within the vacuum chamber 15 as an inert atmosphere of argon gas is fed into it.

According to the Czochralski single crystal growth process, a quantity of polycrystalline silicon, or polysilicon, is charged to crucible 19. A heater power supply 27 provides electric current through the resistance heater 21 to melt the charge and, thus, form a silicon melt 29 from which a single crystal 31 is pulled. As is known in the art, the single crystal 31 starts with a seed crystal 35 attached to a pull shaft, or cable, 37. As shown in FIG. 1, single crystal 31 and crucible 19 generally have a common axis of symmetry 39. One end of cable 37 is connected by way of a pulley (not shown) to a drum (not shown) and the other end is connected to a chuck (not shown) that holds the seed crystal 35 and the crystal 31 grown from the seed crystal. Commonly assigned U.S. Pat. No. 5,935,328, the entire disclosure of which is incorporated herein by reference, shows a drum and cable arrangement suitable for use with the present invention.

During both heating and crystal pulling, a crucible drive unit 43 rotates crucible 19 (e.g., in the clockwise direction). The crucible drive unit 43 also raises and lowers crucible 19 as desired during the growth process. For example, crucible drive unit 43 raises crucible 19 as the melt 29 is depleted to maintain its level, indicated by reference character 45, at a desired height. A crystal drive unit 47 similarly rotates the cable 37 in a direction opposite the direction in which crucible drive unit 43 rotates crucible 19. In addition, the crystal drive unit 47 raises and lowers crystal 31 relative to the melt level 45 as desired during the growth process.

In one embodiment, crystal puller 13 preheats the seed crystal 35 by lowering it nearly into contact with the molten silicon of melt 29 contained by crucible 19. After preheating, crystal drive unit 47 continues to lower seed crystal 35 via cable 37 into contact with melt 29 at its melt level 45. As seed crystal 35 melts, crystal drive unit 47 slowly withdraws, or pulls, it from the melt 29. Seed crystal 35 draws silicon from melt 29 to produce a growth of silicon single crystal 31 as it is withdrawn. Crystal drive unit 47 rotates crystal 31 at a reference rate as it pulls crystal 31 from melt 29. Crucible drive unit 43 similarly rotates crucible 19 at another reference rate, but usually in the opposite direction relative to crystal 31.

The details of construction of crystal drive unit 47 are well known to those of ordinary skill in the art. Generally, drive unit 47 includes a motor (not shown) with its shaft mechanically coupled to the drum. Although this mechanical coupling may comprise a direct connection between the shaft and drum, a preferred arrangement positions a set of reduction gears between the two for better control and smoother operation. The motor is thus operable to let out and reel in cable 37 via the drum for lowering seed crystal 35 into melt 29 and for pulling the ingot 31 from melt 29.

A control unit 51 initially controls the withdrawal, or pull, rate and the power that power supply 27 provides to heater 21 to cause a neck down of crystal 31. Preferably, crystal puller 13 grows the crystal neck at a substantially constant diameter as seed crystal 35 is drawn from melt 29. For example, the control unit 51 maintains a substantially constant neck diameter of about five percent of the desired body diameter. Under a conventional control scheme, control unit 51 adjusts the rotation, pull and/or heating parameters after the neck reaches a desired length to cause the diameter of crystal 31 to increase in a cone-shaped manner until a desired crystal body diameter is reached. For example, control unit 51 decreases the pull rate to create an outwardly flaring region typically referred to as the taper of the crystal. Once the desired crystal diameter is reached, control unit 51 controls the growth parameters to maintain a relatively constant diameter as measured by system 11 until the process approaches its end. At that point, the pull rate and heating are usually increased for decreasing the diameter to form a tapered portion at the end of single crystal 31.

Commonly assigned U.S. Pat. No. 5,178,720, the entire disclosure of which is incorporated herein by reference, discloses one preferred method for controlling crystal and crucible rotation rates as a function of the crystal diameter. Commonly assigned U.S. Pat. No. 5,882,402, U.S. Pat. No. 5,846,318, U.S. Pat. No. 5,665,159 and U.S. Pat. No. 5,653,799, the entire disclosures of which are incorporated herein by reference, provide accurate and reliable measurements of a number of crystal growth parameters, including crystal diameter. In these patents, an image processor processes images of the crystal-melt interface to determine the diameter. Commonly assigned application Ser. No. 09/372,897, filed Aug. 12, 1999, the entire disclosure of which is incorporated herein by reference, teaches accurately pulling a single crystal silicon ingot from a melt according to a predetermined velocity profile, or target, specified in a crystal "recipe" for controlling the formation of defects.

Figure 2:
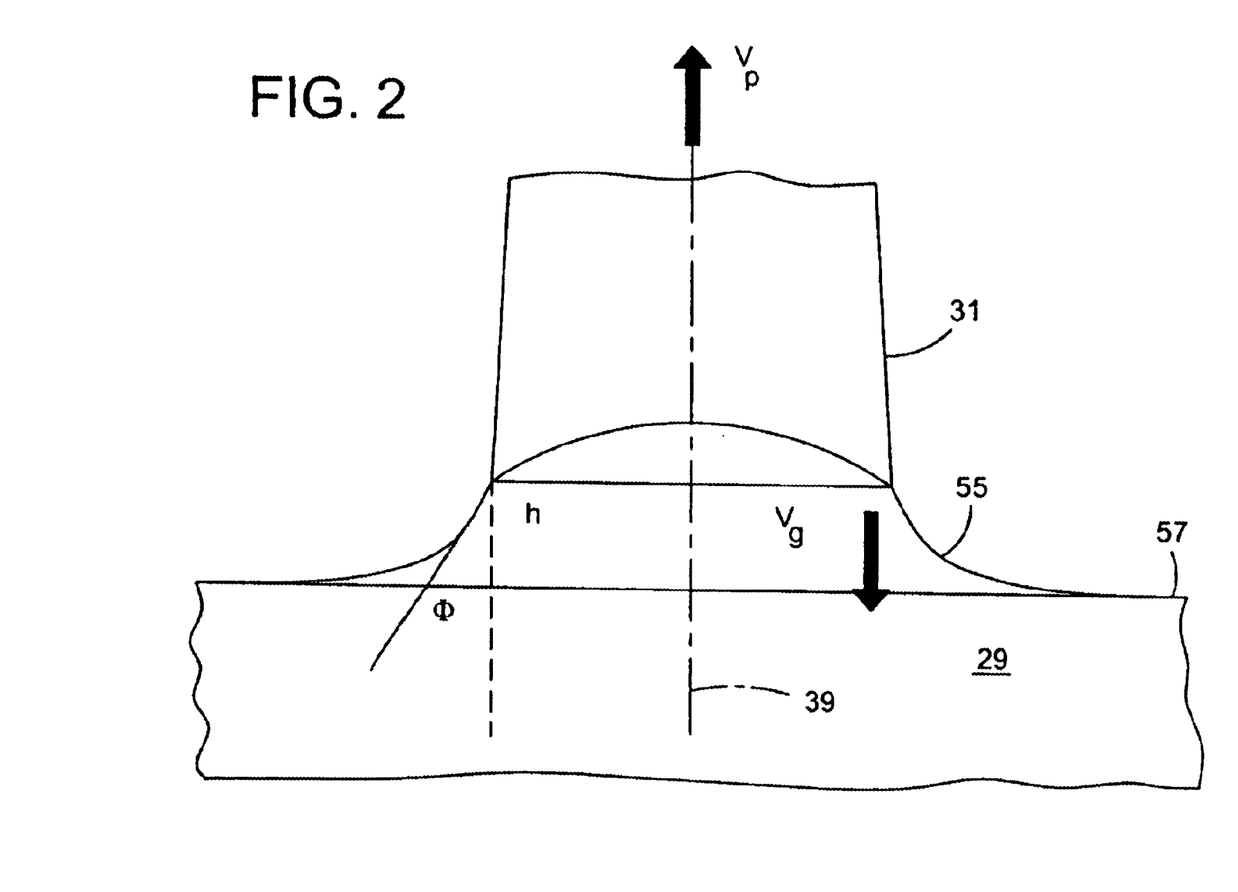
FIG. 2 is a schematic, fragmentary view of a silicon crystal being pulled from a melt contained in the crystal puller of FIG. 1.

FIG. 2 illustrates an intermediate phase of the crystal growth process following melt-down and dipping of seed crystal 35. After formation of a crystal neck, the typical process enlarges the diameter of the growing crystal 31 by decreasing the pulling rate and/or the melt temperature until a desired diameter is reached. This portion of increasing diameter is referred to as a taper, or crown. As the taper increases to a desired diameter, crystal 31 forms a shoulder followed by a main body. As melt 29 approaches depletion, the crystal diameter is gradually decreased resulting in the formation of a generally conical end cone of crystal 31. Once the diameter of the end cone is sufficiently small (e.g., 2 mm to 4 mm), detachment of crystal 31 from melt 29 can be accomplished without causing dislocations to spread to the main body of crystal 31. Crystal 31 is then removed from vacuum chamber 15 for processing into wafers. By controlling the pull rate and the melt temperature while compensating for the decreasing melt level, the body of crystal 31 is grown so that it has an approximately constant diameter and constitutes a generally cylindrical body of crystalline silicon (i.e., an ingot).

As the crystal drive unit 47 pulls crystal 31 from melt 29, a liquid meniscus 55 forms at the interface between crystal 31 and melt 29. The liquid meniscus 55 forms on a surface 57 of melt 29. As is known in the art, the reflection of crucible 19 on meniscus 55 is often visible as a bright ring adjacent crystal 31. FIG. 2 also indicates the height h and slope φ of meniscus 55. In addition, FIG. 2 indicates the relative directions of the pulling velocity, or pull rate, $V_p$ and the growing velocity, or growth rate, $V_g$.

It should be understood that the as-grown crystal body typically will not have an entirely uniform diameter, although it is generally cylindrical. For this reason, the diameter of crystal 31 may vary slightly at different axial positions along axis 39. Further, the diameter varies in the different phases of crystal growth (i.e., seed, neck, taper, body and end cone). Crystal diameter measurements may be determined by a number of methods. For example, several technologies are known for providing crystal diameter measurements including methods of measuring the width of the bright ring. The bright ring is a characteristic of the reflection of the crucible wall in the meniscus that is formed at the solid-liquid interface of crystal 31. Conventional bright ring and meniscus sensors employ optical pyrometers, photocells, rotating mirrors with photocells, light sources with photocells, line-scan cameras, and two-dimensional array cameras. Commonly assigned U.S. Pat. Nos. 5,665,159 and 5,653,799, the entire disclosures of which are incorporated herein by reference, describe a system and method, respectively, for accurately and reliably measuring crystal diameter for use in controlling the growth process of single crystal silicon. Advantageously, the system and method of these patents accurately determine the growing crystal's diameter by processing images of the crystal-melt interface generated by a camera.

Referring again to FIG. 1, control unit 51 includes a programmable logic controller (PLC) 61 having a central processing unit (CPU) 63 and a memory 65. In one embodiment, the PLC 61 receives a position signal representative of the rotational position of the drum and is readily programmed via conventional means to convert the position signal into a numeric figure representing the linear movement of cable 37 in real time. In this manner, PLC 61 calculates the relative position of seed crystal 35 and the pull velocity of cable 37 as a function of the position signal.

In a preferred embodiment of the invention, the PLC 61 of control unit 51 constitutes a model-based controller designed to achieve proper control of the growth rate and diameter of the growing crystal 31. Control unit 51 determines the current growth rate $V_g$, as well as the current steady-state growth rate $V_{gs}$, from radius dynamics. Control unit 51 also operates to control the pull rate around $V_{gs}$ to minimize the deviation in diameter from a set value. As described below, control unit 51 determines a preferred set of control parameters for the next fraction of growth by analyzing diameter excursions previously measured in a given length of grown crystal 31. Such a diameter profile for a given length of crystal 31 provides information regarding radius variations occurring during an observation interval.

The present invention advantageously controls silicon crystal growth to minimize growth rate and diameter variations independent of specific process conditions such as sensed melt temperature. The problem of minimizing growth rate variations involves reliably measuring growth rate. The invention determines a preferred set of control parameters for the next fraction of growth, following the observation interval, by analyzing diameter excursions previously measured in a given length of grown crystal. Such a diameter profile for a given length of crystal provides information regarding radius variations occurring during the observation interval, which is in contrast to merely taking diameter measurements at set intervals (i.e., periodically measuring or sampling the diameter).

The control unit 51 preferably uses a reduced set of control parameters including two basic response constants that are a function of crystal length (e.g., a height response coefficient $A_h$ and a power response coefficient $A_p$). A third parameter, namely, transient time τ, is less important in this embodiment. Control unit 51 preferably deduces the parameters $A_h$ and $A_p$ from a single control run using the series of power pulses or from a global simulation of the temperature field in puller 13 for several values of the meniscus height and power.

Minimizing growth rate variations involves first reliably measuring growth rate. In conventional growth processes, the pull rate $V_p$ is a known parameter since it is set by the seed lift recipe. This recipe also includes a unique height (denoted by $h_s$) for growing a cylindrical ingot of a fixed diameter and any deviation of the meniscus height h from $h_s$ results in a diameter change. In other words, an evolution in diameter occurs because of an error in the meniscus height as a function of time, i.e., h(t). Equation (1), below, defines the radius deviation as a function of the meniscus height deviation:

$$\partial r(t)/\partial t = -(2h_s V_g(t)/a^2)(h(t)-h_s) \qquad (1)$$

where h(t) is the meniscus height (mm); $h_s$ is the steady-state meniscus height (e.g., $h_s$=6.5 mm); r(t) is the crystal radius (mm); $r_s$ is the crystal radius set point (mm); $V_g$ is the growth rate; and a is the capillarity constant (e.g., a=7.6 mm).

The meniscus height evolves if the pull rate $V_p$ deviates from the actual growth rate $V_g$. Thus, if the height h(t) of the meniscus at the interface between crystal 31 and melt 29 is known, the growth rate can be determined indirectly by equation (2), defined below:

$$\partial h(t)/\partial t = V_p(t) - V_g(t) \tag{2}$$

In an ideal case, the body of crystal 31 is perfectly cylindrical and $V_p$ is identical to $V_g$. Since meniscus height variations yield radius variations (see equation (1)), achieving a relatively small fluctuation in crystal diameter is coupled to achieving a relatively small fluctuation in growth rate (see equation (2)). In the present embodiment, information on growth rate is stored in the first derivative of the meniscus height h(t) and, thus, in the second derivative of r(t). It is to be understood that a conventional PID controller ignores this basic quantity.

As described above, the ability to grow silicon crystals with controlled defect properties strongly depends on the ability to control growth rate. A key parameter in modern crystal growth is $V_g/G$, where G is the average axial temperature gradient at the melt/solid interface. Successful defect-free crystal growth is accomplished when the growth rate deviates from a critical value (e.g., $V_g/G$ of about 0.13 mm$^2$/K min.) by less than 5–10%, according to hot zone design, for the entire length of crystal 31. Advantageously, control circuit 51 controls the growth rate to a desired accuracy during the entire CZ crystal growth process even though the thermal conditions change continuously and specifically for particular hot zone configurations or process conditions. In this embodiment, control circuit 51 maintains diameter within a relatively low tolerance from the set value (e.g., 0.5 mm) and the growth rate (averaged over the control cycle) within a relatively low tolerance from the set value (e.g., 0.02 mm/min.) to grow perfect silicon.

As shown by equations (1) and (2), variations in the diameter are a manifestation of the meniscus height oscillations around the steady-state value $h_s$. Accordingly, it implies that the pull rate $V_p$ is not identical to the growth rate $V_g$. Therefore, the requirement of small diameter deviations is actually coupled to the requirement of small growth rate deviations relative to the steady-state value, $V_{gs}$. The growth rate $V_{gs}$ for the steady-state meniscus height $h_s$ is of principal importance for growth control. Generally, $V_g$ (for any meniscus height) is expressed from the heat flux balance at the solid/melt interface by equation (3), below:

$$V_g(t) = [k_s G_s(t) - k_m G_m(t)]/Q \tag{3}$$

where $G_s(t)$ is the solid state temperature gradient (° C./mm); $G_m(t)$ is the liquid state temperature gradient (° C./mm); $k_s$ is the solid phase Si conductivity (J/mm min K); $k_m$ is the liquid phase Si conductivity (J/mm min K); and Q is the heat of fusion (J/mm$^3$). In this instance, $k_s$=1.5 J/mm min K, $k_m$=3 J/mm min K and Q=4.1 J/mm$^3$.

The melt gradient $G_m$ is also sensitive to the meniscus height. In particular, $G_m$ is roughly inversely proportional to h. According to the invention, the derivative of $V_g$ with respect to h provides an important control parameter, namely, the height response coefficient $A_h$ defined by equation (4), below:

$$A_h = \partial V_g/\partial h > 0 \tag{4}$$

In equation (4), the sign is positive since an increased height means a decreased gradient $G_m$.

If puller 13 pulls crystal 31 at $V_p = V_{gs}$, then the meniscus height will automatically go to the value of $h_s$, according to equation (2), after a transient time of $1/A_h$ (e.g., about 5 minutes). After that, the diameter of crystal 31 automatically becomes constant while the actual growth rate $V_g$ becomes identical to $V_{gs}$. According to the invention, the process control executed by control unit 51 deduces $V_{gs}$ from an observed diameter evolution and controls the pull rate at $V_p = V_{gs}$. Next, a proper power increment brings the value of $V_{gs}$ to the set value of $V_{set}$. Increasing the power leads to a higher melt temperature below crystal 31 and, accordingly, to a higher $G_m$ (and to lower $V_g$). The derivative of $V_{gs}$ with respect to the power P is another important control parameter defined by equation (5), below:

$$A_p = \partial V_{gs}/\partial P < 0 \tag{5}$$

Since thermal conditions change continuously during CZ crystal growth, there is the need to accommodate for changes in $V_{gs}$ during the run, by intervening on the power that power supply 27 provides to heater 21 so as to keep $V_{gs}$ close to the set growth rate $V_{set}(t)$. The required power increment is defined by equation (6), below:

$$\delta P = -(V_{gs} - V_{set})/A_p \tag{6}$$

Applying such a power increment causes $V_{gs}$ to move toward the set value of $V_{set}$ after a transient time τ corresponding to the 'crucible heat inertia'. For example, τ is on the order of 20 minutes.

Figure 3:
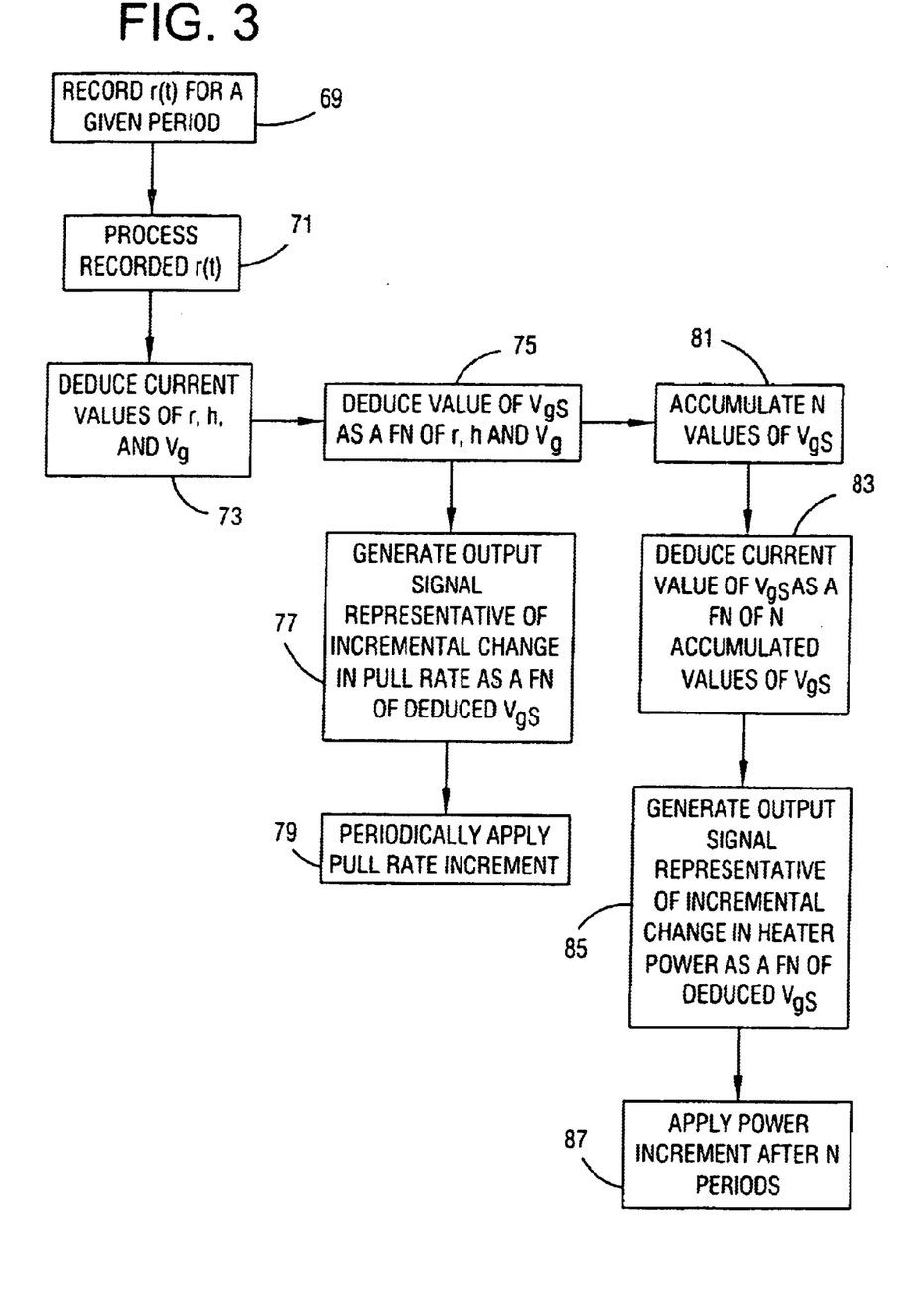
FIG. 3 is an exemplary flow diagram illustrating operation of the apparatus of FIG. 1 to generate control signals for controlling the crystal puller.

Referring now to FIG. 3, the present invention controls the pull rate and heater power to provide growth rate control that is directly translated into simultaneous control of both diameter and growth rate. FIG. 3 illustrates the operation of control unit 51 according to a preferred embodiment of the invention for accomplishing such growth rate control. Beginning at step 69, control unit 51 records the radius function r(t) for a predetermined interval or period of time. Control unit 51 then processes the information at step 71. In processing r(t), control unit 51 first deduces current values of r, h and $V_g$ at step 73. Appendix A describes a best fit analysis of the observed r(t) function for deducing these values according to the invention.

Figure 4:
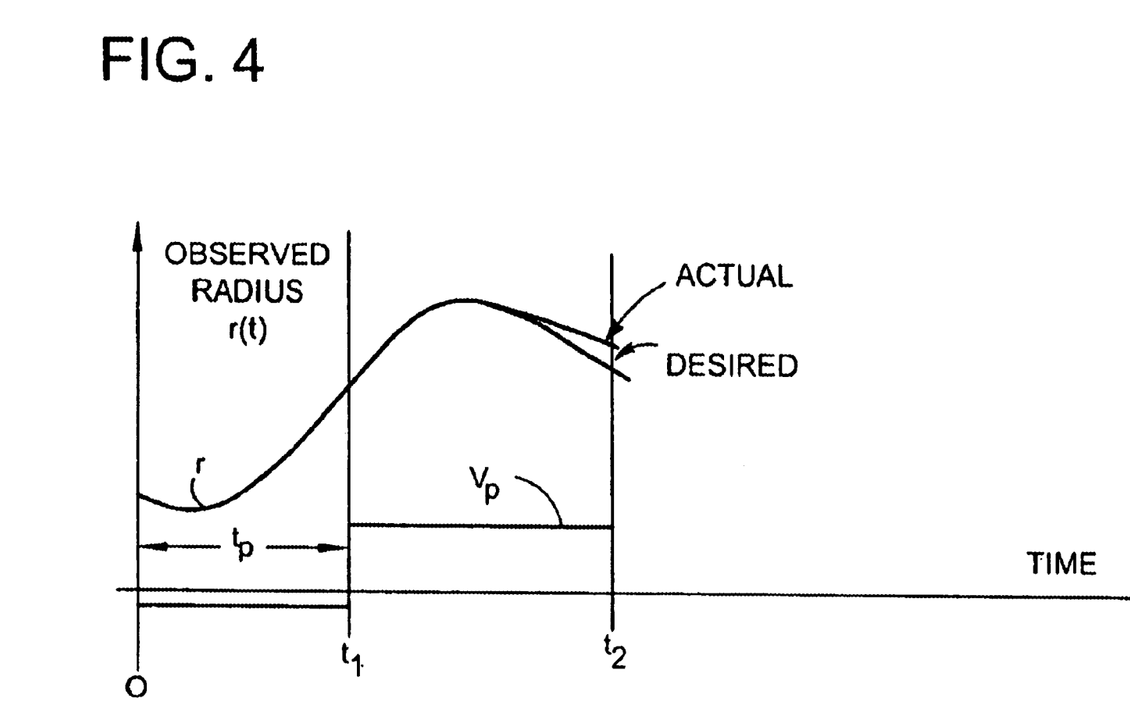
FIG. 4 is an exemplary graph illustrating crystal radius deviations as affected by incremental changes in pull rate and heater power as controlled by the apparatus of FIG. 1.

In a preferred embodiment of the invention, the model-based controller embodied by control unit 51 processes the open loop radius variation r(t) recorded for the given interval of time to deduce the current values of r, h and $V_g$ (and then $V_{gs}$). Proceeding to step 75, control unit 51 further processes the deduced values of r, h and $V_g$ to deduce a current value of the steady-state growth rate $V_{gs}$. At step 77, control unit 51 generates an output signal representative of an incremental change in pull rate as a function of the deduced variable $V_{gs}$. Control unit 51 then applies each pull rate increment, or pull action, to crystal drive unit 47 with a given periodicity (i.e., at the end of each observation interval) at step 79. FIG. 4 is an exemplary graph illustrating deviations in the radius of crystal 31 relative to time and comparing the actual radius that results from an incremental change in pull rate to the desired radius at the end of the particular interval.

Referring again to FIG. 3, control unit 51 observes r(t) over N observation periods, each of approximately equal duration. The period duration $t_p$ is preferably on the order of the meniscus response time $1/A_h$ or somewhat longer (e.g., about 10 to 20 minutes). At step 81, after N periods and, thus, after N pull actions, control unit 51 accumulates N values of $V_{gs}$. The current value of $V_{gs}$ (used in the power action recipe equation (6)) is deduced using the N accumulated values for $V_{gs}$. Control unit 51 accumulates the values of $V_{gs}$ at step 81 and deduces the current value of $V_{gs}$ for the power action accordingly at step 83. This accumulation is important to reduce an error in $V_{gs}$ caused by a noise in the measured diameter. At step 85, control unit 51 generates an output signal representative of an incremental change in heater power as a function of the deduced variables and then, at step 87, applies a power action to heater power supply 27 according to the power increment specified in equation (6).

In one embodiment, the number of pull periods N that precedes the power action is about six so that the period between power actions is about one hour or more. Crystal 31 grows about 2 cm in length during each period (for growth conditions required for perfect silicon). The output increments in pull rate and heater power are intended to minimize, respectively, diameter and growth rate deviations.

The approach is thus to leave crystal 31 'at peace' for some time to obtain sufficient information on the r(t) function at an essentially constant pull rate. Then, the current variables r and h and the current values of $V_g$ and $V_{gs}$ can be reliably deduced even in the presence of measurement noise. These variables being known, one can predict the future behavior of both r(t) and h(t) for any new value of $V_p$ and, thus, choose the best new $V_p$ to reduce both the radius deviation and the height deviation. The second goal is even more important since the derivative dr/dt is then reduced (see equation (1)). Therefore, a 'calm behavior' of diameter during future periods is ensured.

Figure 5:
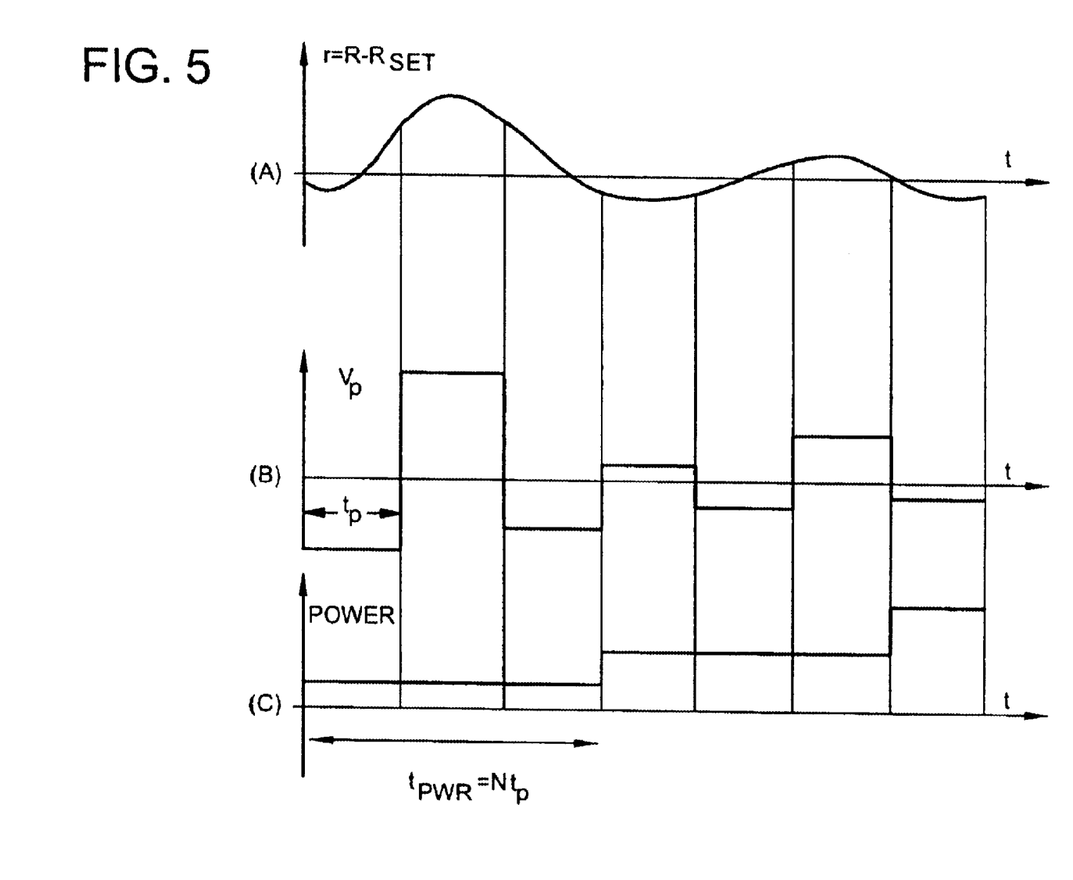
FIG. 5 is an exemplary graph further illustrating crystal radius deviations as affected by incremental changes in pull rate and heater power as controlled by the apparatus of FIG. 1.

FIG. 5 is an exemplary graph illustrating crystal radius deviations as affected by incremental changes in pull rate and heater power as controlled by the apparatus of FIG. 1. FIG. 5(a) shows the difference between the actual radius r and a desired radius $r_{set}$ over time. FIGS. 5(b) and 5(c) show the incremental pull and power actions, respectively. In the example of FIG. 5(c), control unit 51 applies the first power action after the first observation period of 10 minutes and, afterwards, applies such actions after every N periods where N=6.

Appendix B describes an exemplary pull rate recipe according to the invention.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

APPENDIX A

According to the invention, an analysis of the observed r(t) function yields the current values of r, h and $V_g$ (and then $V_{gs}$). For this purpose, the growth rate $V_g(t)$ in the basic equations (1) and (2) is expanded with respect to the meniscus height:

$$V_g = V_{gf} + A_h(h - h_f) \tag{A-1}$$

where $h_f$ and $V_{gf}$ are the current values (corresponding to the end of the observation period). As such, equation (1) is linear but equation (2) is essentially non-linear. Yet the solution for r(t) at specified values of $h_f$, $V_{gf}$ and $r_f$ (the radius at the end of the observation) is easily obtained in the analytical form:

$$r(t) = r_f + A[Y(h_f - h_s)x + (Y + h_f - h_s)Z(x + 1 - e^x) + Z^2(x + 1.5 - 2e^x + 0.5e^{2x})] \tag{A-2}$$

where $x = A_h t$; and the time t is counted back from the end to the start of the observation period.

The parameters Y and Z are growth/pull rate combinations:

$$Y = V_{gf}/A_h$$

$$Z = (V_p - V_{gf})/A_h$$

and the capillarity parameter is defined by:

$$A = 2h_s/a^2$$

The theoretical function r(t) includes the current system variables $r_f$ and $h_f$, the current growth rate $V_{gf}$ and the basic system parameter $A_h$ (i.e., the height response coefficient), all of which are to be determined. In a preferred embodiment, these four numbers are fitted to the measured function $r_{exp}(t)$ to get the least square deviation of r(t) from $r_{exp}(t)$. It is expected that noise in the function $r_{exp}(t)$ prevents it from providing a reliable value for $A_h$. For this reason, the present invention specifies a value for $A_h$, which in turn permits control unit 51 to reliably deduce the three numbers $r_f$, $h_f$ and $V_{gf}$ by the best fit routine described above. Preferably, the present invention also recalculates $V_{gs}$, the growth rate at the steady-state meniscus height, which is a relevant quantity defining a proper intervention on the pull rate and power. This important quantity is recalculated from the fitted numbers for $V_{gf}$ and $h_f$:

$$V_{gs} = V_{gf} - A_h(h_f - h_s) \tag{A-3}$$

APPENDIX B

At the end of the observation period, the current values of r, h and $V_{gs}$ are determined, obtained by the best fit routine described above in Appendix A. The values $r_f$ and $h_f$ are the final ones for the previous observation period but are starting values for the next period. Accordingly, these values are now denoted $r_o$ and $h_o$. Integration of the dynamics equations (1) and (2) is now made in the forward direction, from the start to the end, using the expansion of $V_g(h)$ around the steady-state height. In this manner, the predicted new final values for h and r are obtained:

$$h = h_s + Z + (h_o - h_s)e^{-x} \tag{B-1}$$

$$r = r_o - A[YZx + (2Z + Y)(h_o - h_s - Z)(1 - e^{-x}) + 0.5(h_o - h_s)^2(1 - e^{-2x})] \tag{B-2}$$

where $t_p$ is the period duration; and $x = A_h t_p$. The parameters A, Y and Z are as defined above except $V_{gs}$ replaces $V_{gf}$.

To select the new value of the pull rate (entering the equations through the parameter $Z = (V_p - V_{gs})/A_h$), the current values of $r_o - r_{set}$ and $h_o - h_s$ are first checked. Preferably, the values are 'safe' to the prescribed diameter deviation (e.g., the radius deviation should not exceed some limit, $\Delta r = 0.5$ mm). The 'safe' situation means that pulling at the rate of $V_p = V_{gs}$ will not cause the radius to deviate by more than $\Delta r$. From equation (B-2), the predicted r for this case, where Z=0, is:

$$r = r_o - A[Y(h_o - h_s)(1 - e^{-x}) + 0.5(h_o - h_s)^2(1 - e^{-2x})] \tag{B-3}$$

So if $|r - r_o|$ is within the $\Delta r$ limit, then the recipe for the pull rate is simplified:

$$V_p = V_{gs} \tag{B-4}$$

As noted above, pulling at this rate automatically brings the meniscus height to the desired steady-state value of $h_s$ since $h_o - h_s = (h_o - h_s)e^{-x}$ according to equation (B-1) However, noise-induced error in the deduced value of $V_{gs}$, for example, may cause the predicted radius from equation (B-3) to go beyond the prescribed error of $\Delta r$. In such an instance, a proper height deviation may be introduced to reduce the radius deviation. For this purpose, $V_p$ should deviate from $V_{gs}$. The proper $V_p$ should be such that the new final values of $r - r_{set}$ and $h - h_s$ are of the same sign (e.g., positive deviation $r - r_{set}$ will decay at positive $h - h_s$ according to equation (2)). The fastest subsequent decay is achieved if:

$$(r - r_{set})/(h - h_s) = AV_{gs}/A_h \tag{B-5}$$

according to equations (B-1) and (B-2).

Therefore, $V_p$ is chosen to bring r and h to the desired condition as specified in equation (B-5). For this purpose, a computational cycle over $V_p$ is made to look at the final r and h values specified as the functions of $V_p$ by equations (B-1) and (B-2) defining h and r, respectively. The value of $V_p$ resulting in the relation of equation (B-5) is selected as the recipe for the pull action. In one preferred embodiment, limitations are imposed on $V_p$ (e.g., to be positive but less than a threshold) and on $|h-h_s|$ (e.g., to be less than or equal to about 1 mm) to ensure the applicability of the basic meniscus equation (1). Thus, the finally accepted $V_p$ is the value that brings the ratio $(r-r_{set})/(h-h_s)$ as close as possible to the goal ratio $AV_{gs}/A_h$ of equation (B-5) within the imposed limitations.

What is claimed is:

1. A control method for use with a crystal puller for growing a monocrystalline semiconductor crystal according to the Czochralski process, said crystal puller having a heated crucible containing a semiconductor melt from which the crystal is grown at a growth rate $V_g$, said melt having a surface forming a meniscus adjacent the crystal, said crystal puller further having a heater supplied by a power supply for heating the crucible, said crystal being grown on a seed crystal pulled from the melt at a pull rate $V_p$, said method comprising the steps of:

defining an interval of time for observing growth of the crystal being pulled from the melt;

determining variations in crystal diameter occurring during the observation interval;

estimating a current value of the growth rate $V_{gf}$ as a function of the determined variations in crystal diameter;

estimating a current steady-state value of the growth rate $V_{gs}$ as a function of the estimated growth rate $V_{gf}$ at the end of the observation interval;

determining a pull rate parameter as a function of the estimated steady-state growth rate $V_{gs}$ and independent of a temperature condition sensed during pulling, said pull rate parameter being representative of an incremental change in the pull rate $V_p$ to effect a desired change in the diameter of the crystal toward a target diameter;

determining a heater power parameter as a function of the estimated steady-state growth rate $V_{gs}$ and independent of a temperature condition sensed during pulling, said heater power parameter being representative of an incremental change in the power supplied to the healer to effect a desired change in the growth rate of the crystal toward a target growth rate; and adjusting the pull rate $V_p$ according to the pull rate parameter and adjusting the power supplied to the heater by the power supply according to the heater power parameter thereby minimizing variations in both crystal diameter and growth rate during subsequent growth of the crystal following the observation interval.

2. The method of claim 1 further comprising repeating the step of determining variations in crystal diameter for N observation intervals.

3. The method of claim 2 wherein the steps of determining the heater power parameter and adjusting the power supplied to the heater occur after every N observation intervals.

4. The method of claim 2 further comprising repeating the steps of determining the pull rate parameter and adjusting the pull rate for each of the N observation intervals.

5. The method of claim 2 wherein the step of adjusting the pull rate occurs at the end of each observation interval.

6. The method of claim 2 further comprising the step of accumulating values of the estimated steady-state growth rate $V_{gs}$ over the N observation intervals.

7. The method of claim 6 wherein the step of estimating the steady-state growth rate $V_{gs}$ includes estimating a current steady-state value of the growth rate $V_{gs}$ as a function of the N accumulated values of the estimated steady-state growth rate $V_{gs}$ and wherein the step of adjusting the pull rate includes controlling the pull rate $V_p$ as a function of the estimated steady-state growth rate $V_{gs}$ to minimize subsequent variations in crystal diameter relative to the target diameter.

8. The method of claim 7 wherein the step of adjusting the power supplied to the heater by the power supply includes adjusting the power so that the estimated steady-state growth rate $V_{gs}$ is approximately equal to a predetermined target growth rate $V_{set}$.

9. The method of claim 7 wherein the step of adjusting the power supplied to the heater by the power supply includes defining a power increment $\delta P$ according to:

$$\delta P = (V_{gs} V_{set})/A_p;$$

and applying said power increment $\delta P$ to the crystal puller for adjusting the heat of the crucible to cause the estimated steady-state growth rate $V_{gs}$ to move toward a desired growth rate set value $V_{set}$; and where $A_p$ is a predetermined power response coefficient.

10. The method of claim 9 wherein the power response coefficient $A_p$ is defined by a derivative of the estimated steady-state growth rate $V_{gs}$ relative to the power supplied to the heater.

11. The method of claim 1 wherein the length of the observation interval is inversely related to a predetermined height response coefficient $A_h$.

12. The method of claim 1 wherein the step of estimating a current steady-state value of the growth rate $V_{gs}$ comprises:

defining a function r(t) based on the variations in crystal diameter occurring during the observation interval, said function r(t) being representative of radius variations and being a function of crystal radius r, meniscus height h and growth rate $V_g$ with respect to time; and performing a best fit routine on the function r(t) to deduce current values of crystal radius $r_f$, meniscus height $h_f$ and growth rate $V_{gf}$ at the end of the observation interval.

13. The method of claim 12 wherein the step of performing the best fit routine includes defining the function r(t) as:

$$r(t) = r_f + A[Y(h_f h_s)x + (Y + h_f h_s)Z(x + 1e^x) - Z^2(x + 1.5 - 2e^x + 0.5e^{2x})];$$

where $x = A_h t$; $Y = V_{gf} A_h$; $Z = (V_p V_{gf})/A_h$; and $A = 2h_s/a^2$; and where $A_h$ is a predetermined height response coefficient; the time t is counted back from the end to the start of the observation interval: $h_s$ is a steady-state meniscus height; and a is a capillarity parameter.

14. The method of claim 1 wherein the step of determining the pull rate parameter includes predicting a new value of $V_p$ to reduce subsequent variations in crystal diameter and maintain the meniscus height approximately constant.

15. The method of claim 1 further comprising the steps of determining a set of control parameters for a fraction of crystal growth following the initial observation interval as a function of the variations in crystal diameter during the observation interval and controlling the growth of the crystal as a function of the control parameters.

16. The method of claim 15 wherein the set of control parameters comprises a height response coefficient $A_h$ and a power response coefficient $A_p$.

17. The method of claim 16 wherein the height response coefficient $A_h$ is defined by a derivative of the growth rate $V_g$ relative to meniscus height h.

18. The method of claim 16 wherein the power response coefficient $A_p$ is defined by a derivative of the estimated steady-state growth rate $V_{gs}$ relative to the power supplied to the heater.

19. The method of claim 1 further comprising the step of pulling the growing crystal from the melt at a first target pull rate during the observation interval, said first target pull rate being substantially constant.

20. A control method for use with a crystal puller for growing a monocrystalline semiconductor crystal according to the Czochralski process, said crystal puller having a heated crucible containing a semiconductor melt from which the crystal is grown at a growth rate of $V_g$, said melt having a surface forming a meniscus adjacent the crystal, said crystal puller further having a heater supplied by a power supply for heating the crucible, said crystal being grown on a seed crystal pulled from the melt at a pull rate $V_p$, said method comprising the steps of:

defining an interval of time for observing growth of the crystal being pulled from the melt;

determining variations in crystal diameter occurring during the observation interval;

defining a function r(t) based on the variations in crystal diameter occurring during the observation interval, said function r(t) being representative of radius variations and being a function of current values of crystal radius r, meniscus height h and growth rate $V_g$ with respect to time;

performing a best fit routine on the function r(t) to deduce the current values of crystal radius $r_f$, meniscus height $h_f$ and growth rate $V_{gf}$ at the end of the observation interval;

calculating a current steady-state value of the growth rate $V_{gs}$ as a function of the deduced current values of crystal radius $r_f$, meniscus height $h_f$ and growth rate $V_{gf}$ at the end of the observation interval and independent of melt temperature and meniscus height sensed during pulling; and controlling the crystal puller as function of current steady-state growth rate $V_{gs}$ to minimize variations in both crystal diameter and growth rate during subsequent growth of the crystal.

21. A control method for use with a crystal puller for growing a monocrystalline semiconductor crystal according to the Czochralski process, said crystal puller having a heated crucible containing a semiconductor melt from which the crystal is grown at a growth rate $V_g$, said melt having a surface forming a meniscus adjacent the crystal, said crystal puller further having a heater supplied by a power supply for heating the crucible, said crystal being grown on a seed crystal pulled from the melt at a pull rate $V_p$, said method comprising the steps of:

defining an interval of time for observing growth of the crystal being pulled from the melt;

determining variations in crystal diameter occurring during the observation interval;

estimating a current value of the growth rate $V_{gf}$ as a function of the determined variations in crystal diameter;

estimating a current steady-state value of the growth rate $V_{gs}$ as a function of the estimated growth rate $V_{gf}$ at the end of the observation interval and independent of meniscus height measured during pulling;

determining a pull rate parameter as a function of the estimated steady-state growth rate $V_{gs}$, said pull rate parameter being representative of an incremental change in the pull rate $V_p$ to effect a desired change in the diameter of the crystal toward a target diameter;

determining a heater power parameter as a function of the estimated steady-state growth rate $V_{gs}$, said heater power parameter being representative of an incremental change in the power supplied to the heater to effect a desired change in the growth rate of the crystal toward a target growth rate; and adjusting the pull rate $V_p$ according to the pull rate parameter and adjusting the power supplied to the heater by the power supply according to the heater power parameter thereby simultaneously minimizing variations in both crystal diameter and growth rate during subsequent growth of the crystal following the observation interval.

22. The method of claim 21 further comprising repeating the step of determining variations in crystal diameter for N observation intervals and accumulating values of the estimated steady-state growth rate $V_{gs}$ over the N observation intervals.

23. The method of claim 22 wherein the steps of determining the heater power parameter and adjusting the power supplied to the heater occur after every N observation intervals.

24. The method of claim 22 further comprising repeating the steps of determining the pull rate parameter and adjusting the pull rate for each of the N observation intervals.

25. The method of claim 22 wherein the step of adjusting the pull rate occurs at the end of each observation interval.

26. The method of claim 22 wherein the step of estimating the steady-state growth rate $V_{gs}$ includes estimating a current steady-state value of the growth rate $V_{gs}$ as a function of the N accumulated values of the estimated steady-state growth rate $V_{gs}$ and wherein the step of adjusting the pull rate includes controlling the pull rate $V_p$ as a function of the estimated steady-state growth rate $V_{gs}$ to minimize subsequent variations in crystal diameter relative to the target diameter.

27. The method of claim 26 wherein the step of adjusting the power supplied to the heater by the power supply includes adjusting the power so that the estimated steady-state growth rate $V_{gs}$ is approximately equal to a predetermined target growth rate $V_{set}$.

28. The method of claim 26 wherein the step of adjusting the power supplied to the heater by the power supply includes defining a power increment δP according to:

$$\delta P = (V_{gs} V_{set})/A_p;$$

and applying said power increment δP to the crystal puller for adjusting the heat of the crucible to cause the estimated steady-state growth rate $V_{gs}$ to move toward a desired growth rate set value $V_{set}$; and where $A_p$ is a predetermined power response coefficient defined by a derivative of the estimated steady-state growth rate $V_{gs}$ relative to the power supplied to the heater.

29. The method of claim 21 wherein the length of the observation interval is inversely related to a predetermined height response coefficient $A_h$ defined by a derivative of the growth rate $V_g$ relative to meniscus height h.

30. The method of claim 21 wherein the step of estimating a current steady-state value of the growth rule $V_{gs}$ comprises:

defining a function r(t) based on the variations in crystal diameter occurring during the observation interval, said function r(t) being representative of radius variations and being a function of current values of crystal radius r, meniscus height h and growth rate $V_g$ with respect to time; and performing a best fit routine on the function r(t) to deduce the current values of crystal radius $r_f$, meniscus height $h_f$ and growth rate $V_{gf}$ at the end of the observation interval.

31. The method of claim 30 wherein the step of performing the best fit routine includes defining the function r(t) as:

$$r(t)=r_f+A[Y(h_f-h_s)x+(Y+h_f h_s)Z(x+1e^x)+Z^2(x+1.5-2e^{2x})];$$

where $x=A_h t$; $Y=V_{gf}/A_h$; $Z=(V_p-V_{gf})/A_h$; and $A=2h_s/a^2$; and where $A_h$ is a predetermined height response coefficient; the time t is counted back from the end to the start of the observation interval: $h_s$ is a steady-state meniscus height; and a is a capillarity parameter.

32. The method of claim 21 wherein the step of determining the pull rate parameter includes predicting a new value of $V_p$ to reduce subsequent variations in crystal diameter and maintain the meniscus height approximately constant.

* * * * *

UNITED STATES PATENT AND TRADEMARK OFFICE
CERTIFICATE OF CORRECTION

PATENT NO. : 6,726,764 B2
DATED : April 27, 2004
INVENTOR(S) : Paolo Mutti and Vladimir V. Voronkov It is certified that error appears in the above-identified patent and that said Letters Patent is hereby corrected as shown below:

Title page,
Item [75], Inventors, "Vladmir V. Voronknov" should read -- Vladimir V. Voronkov --

Column 13,
Line 44, "to the healer" should read -- to the heater --.

Column 14,
Line 18, "$\delta P=(V_{gs}V_{set})/A_p;$" should read -- $\delta P=-(V_{gs}-V_{set})/A_p;$ --.
Line 47, "$r(t)=r_f+A[Y(h_fh_s)x+(Y+h_fh_s)Z(x+1e^x)-Z^2(x+1.5-2e^x+0.5e^{2x})];$" should read -- $r(t)=r_f+A[Y(h_f-h_s)x+(Y+h_f-h_s)Z(x+1-e^x)+Z^2(x+1.5-2e^x+0.5e^{2x})];$ --.
Line 49, "$Y=V_{gf}A_h; Z=(V_pV_{gf})/A_h;$" should read -- $Y=V_{gf}/A_h; Z=(V_p-V_{gf})/A_h;$ --.
Line 53, "interval:" should read -- interval; --.

Column 15,
Line 43, "puller as function of" should read -- puller as a function of --.

Column 16,
Line 53, "$\delta P=(V_{gs}V_{set})/Ap;$" should read -- $\delta P=-(V_{gs}-V_{set})/A_p;$ --.

Column 17,
Line 2, "growth rule" should read -- growth rate --.

Column 18,
Line 1, "$r(t)=r_f+A[Y(h_f-h_s)x+(Y+h_fh_s)Z(x+1-e^x)+Z^2(x+1.5-2e^{2x})]$" should read Signed and Sealed this Ninth Day of August, 2005

JON W. DUDAS
*Director of the United States Patent and Trademark Office*

UNITED STATES PATENT AND TRADEMARK OFFICE
CERTIFICATE OF CORRECTION

PATENT NO. : 6,726,764 B2
DATED : April 27, 2004
INVENTOR(S) : Paolo Mutti and Vladimir V. Voronkov It is certified that error appears in the above-identified patent and that said Letters Patent is hereby corrected as shown below:

Title page,
Item [75], Inventors, "Vladmir V. Voronknov" should read -- Vladmir V. Voronkov --.

Column 13,
Line 44, "to the healer" should read -- to the heater --.

Column 14,
Line 18, "$\delta P=(V_{gs}V_{set})/A_p$;" should read -- $\delta P=-(V_{gs}-V_{set})/A_p$; --.
Line 47, "$r(t)=r_f+A[Y(h_f h_s)x+(Y+h_f h_s)Z(x+1e^x)-Z^2(x+1.5-2e^x+0.5e^{2x})]$;" should read -- $r(t)=r_f+A[Y(h_f-h_s)x+(Y+h_f-h_s)Z(x+1-e^x)+Z^2(x+1.5-2e^x+0.5e^{2x})]$; --.
Line 49, "$Y=V_{gf}A_h$; $Z=(V_p V_{gf})/A_h$;" should read -- $Y=V_{gf}/A_h$; $Z=(V_p-V_{gf})/A_h$; --.
Line 53, "interval:" should read -- interval; --.

Column 15,
Line 43, "puller as function of" should read -- puller as a function of --.

Column 16,
Line 53, "$\delta P=(V_{gs}V_{set})/Ap$;" should read -- $\delta P=-(V_{gs}-V_{set})/A_p$; --.

Column 17,
Line 2, "growth rule" should read -- growth rate --.

UNITED STATES PATENT AND TRADEMARK OFFICE
CERTIFICATE OF CORRECTION

PATENT NO. : 6,726,764 B2
DATED : April 27, 2004
INVENTOR(S) : Paolo Mutti and Vladimir V. Voronkov

It is certified that error appears in the above-identified patent and that said Letters Patent is hereby corrected as shown below:

Column 18,
Line 1, "$r(t)=r_f+A[Y(h_f-h_s)x+(Y+h_fh_s)Z(x+1e^x)+Z^2(x+1.5-2e^{2x})]$" should read
-- $r(t)=r_f+A[Y(h_f-h_s)x+(Y+h_f-h_s)Z(x+1-e^x)+Z^2(x+1.5-2e^x+0.5e^{2x})]$ --.

This certificate supersedes Certificate of Correction issued August 9, 2005.

Signed and Sealed this

Twenty-eighth Day of February, 2006

JON W. DUDAS
*Director of the United States Patent and Trademark Office*